(12) United States Patent
Schmidt (10) Patent No.: US 10,050,631 B1
(45) Date of Patent: Aug. 14, 2018

(54) SYSTEMS AND METHODS FOR SYNCHRONIZING MULTIPLE OSCILLOSCOPES

(71) Applicant: Keysight Technologies, Inc., Minneapolis, MN (US)

(72) Inventor: Thomas L Schmidt, Colorado Springs, CO (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 15/586,571

(22) Filed: May 4, 2017

(51) Int. Cl.
*H03L 7/00* (2006.01)
*H03K 5/159* (2006.01)
*G01R 13/02* (2006.01)

(52) U.S. Cl.
CPC ............ *H03L 7/00* (2013.01); *G01R 13/0254* (2013.01); *H03K 5/159* (2013.01)

(58) Field of Classification Search
None
See application file for complete search history.

(56) References Cited

U.S. PATENT DOCUMENTS

| | | | |
|---|---|---|---|
| 6,611,724 B1 * | 8/2003 | Buda | G05B 19/0428 700/49 |
| 6,941,400 B2 | 9/2005 | Hungerbuehler | |
| 7,624,294 B2 | 11/2009 | Conway | |
| 8,542,005 B2 | 9/2013 | Kharrati | |
| 9,026,402 B2 | 5/2015 | Delbue | |
| 2008/0061765 A1 * | 3/2008 | Arnoux | G01R 13/02 324/76.39 |
| 2016/0077131 A1 | 3/2016 | Hickman | |

* cited by examiner

*Primary Examiner* — Cassandra Cox (57) ABSTRACT

In an exemplary embodiment of the present invention, a master oscilloscope propagates a slave signal to one or more slave oscilloscopes. The slave signal includes a synchronized trigger pulse that is used in the master oscilloscope to provide a display of a first signal and also includes a timing interpolation parameter which indicates a timing delay applied in the master oscilloscope with respect to the synchronized trigger pulse when providing the display. A slave oscilloscope can use the synchronized trigger pulse and the timing interpolation parameter to provide a display of a second signal on the slave oscilloscope, thereby ensuring that a triggered edge of the second signal is time-aligned with a triggered edge of the first signal. This arrangement reduces/eliminates absolute as well as relative timing uncertainties when an observer observes the first signal displayed on the master oscilloscope and/or the second signal displayed on the slave oscilloscope.

20 Claims, 8 Drawing Sheets

SYSTEMS AND METHODS FOR SYNCHRONIZING MULTIPLE OSCILLOSCOPES

BACKGROUND

An oscilloscope is an instrument that is often used to generate a visual representation of various types of electrical signals. Oscilloscopes can be broadly classified under two different categories—analog oscilloscopes and digital oscilloscopes. Analog oscilloscopes, which use analog circuitry for processing and displaying a signal, provide some benefits but tend to be limited in terms of certain capabilities. On the other hand, digital oscilloscopes can address several limitations associated with analog oscilloscopes, in large part due to the ability of digital oscilloscopes to convert an analog input signal into digital data that can be operated upon and manipulated in various ways to suit a user's needs.

Typically, various factors such as cost, packaging limitations, and customer requirements, tend to make manufacturers produce digital oscilloscopes with a limited number of input signal ports (typically two input signal ports). In some cases, however, a customer may desire to view several more signals than a single digital oscilloscope can accommodate. Conventionally this can be achieved by using multiple digital oscilloscopes that are configured to synchronize with each other by using synchronizing trigger signals that coordinate the display of individual waveforms on the multiple oscilloscopes. However, several of these conventional techniques that are used to synchronize multiple oscilloscopes can suffer from various shortcomings such as having unacceptable levels of jitter, triggering ambiguities, timing ambiguities, and timing delays.

SUMMARY

One or more exemplary embodiments of the present invention can provide a technical effect and/or solution to execute a synchronization technique that allows a master oscilloscope to propagate a slave signal to one or more slave oscilloscopes. In one exemplary implementation, the slave signal includes a synchronized trigger pulse and a timing interpolation parameter. The synchronized trigger pulse is used in the master oscilloscope to provide a display of a first input signal on a display screen of the master oscilloscope and the timing interpolation parameter indicates a timing delay that is applied in the master oscilloscope with respect to the synchronized trigger pulse when providing the display on the display screen. A slave oscilloscope can use the synchronized trigger pulse and the timing interpolation parameter to provide a display of a second input signal on a display screen of the slave oscilloscope, thereby ensuring that a triggered edge of the second input signal is time-aligned with a triggered edge of the first input signal.

According to one exemplary embodiment of the present invention, a master oscilloscope can include a first circuit that generates a first clock, a second circuit that generates a first trigger signal by applying a trigger threshold to an input signal coupled into the master oscilloscope, a third circuit that generates a second trigger signal by using the first clock to synchronize the first trigger signal, a fourth circuit that generates a timing interpolation parameter where the timing interpolation parameter providing a measure of a timing relationship between the first trigger signal and the second trigger signal, a fifth circuit that generates a slave signal comprising the second trigger signal and the timing interpolation parameter, and a sixth circuit that transmits the slave signal to an output port of the master oscilloscope.

According to another exemplary embodiment of the present invention, a slave oscilloscope can include an input interface configured to receive an input signal coupled into the slave oscilloscope, a first circuit configured to receive a first clock, at least one analog to digital converter configured to convert the input signal into digital data representing the input signal, a second circuit configured to receive a slave signal, the slave signal comprising a first trigger signal and a timing interpolation parameter, the timing interpolation parameter providing a measure of a timing relationship between a first trigger signal and a second trigger signal used in a master oscilloscope, a third circuit configured to use the first trigger signal and the timing interpolation parameter to apply a timing characteristic upon the digital data representing the input signal, and a fourth circuit configured to use the digital data having the applied timing characteristic, to provide a visual representation of the input signal on a display screen of the slave oscilloscope.

According to yet another exemplary embodiment of the present invention, a method can include coupling a first input signal into a master oscilloscope, generating a first trigger signal based in part on using the first input signal, generating a second trigger signal by applying a first clock to the first trigger signal, generating a timing interpolation parameter that is indicative of a time delay between the first trigger signal and the second trigger signal, using the second trigger signal and the timing interpolation parameter to provide a first visual representation of the first input signal on a display screen of the master oscilloscope, and generating a slave signal that includes the second trigger signal and the timing interpolation parameter, the slave signal useable by a slave oscilloscope to provide a second visual representation of a second input signal on a display screen of the slave oscilloscope, the second visual representation having a timing alignment with the first visual representation.

Other embodiments and aspects of the present invention will become apparent from the following description taken in conjunction with the associated drawings.

BRIEF DESCRIPTION OF THE FIGURES

Many aspects of the invention can be better understood by referring to the following description in conjunction with the accompanying claims and figures. Like numerals indicate like structural elements and features in the various figures. For clarity, not every element may be labeled with numerals in every figure. The drawings are not necessarily drawn to scale; emphasis instead being placed upon illustrating the principles of the invention. The drawings should not be interpreted as limiting the scope of the invention to the example embodiments shown herein.

DETAILED DESCRIPTION

Throughout this description, embodiments and variations are described for the purpose of illustrating uses and implementations of inventive concepts. The illustrative description should be understood as presenting examples of inventive concepts, rather than as limiting the scope of the concepts as disclosed herein. Towards this end, certain words and terms are used herein solely for convenience and such words and terms should be broadly understood as encompassing various objects and actions that are generally understood in various forms and equivalencies by persons of ordinary skill in the art. For example, the phrase "timing interpolation parameter" as used herein generally pertains to information that can be provided in various forms by a master oscilloscope to one or more slave oscilloscopes for purposes of indicating a timing delay that is applied in the master oscilloscope with respect to a synchronized trigger pulse when displaying a signal on the master oscilloscope. As another example, the word "substantially" as used herein can indicate certain tolerance values that apply to a theoretically "equal" or "coincident" condition when taking real life parameters into consideration. Thus, for example, a transitioning edge of a first signal that is theoretically coincident with a transitioning edge of another signal can have some tolerance as a result of various conditions such as a propagation delay through an integrated circuit and/or manufacturing-related variances. It should also be understood that the word "example" as used herein is intended to be non-exclusionary and non-limiting in nature. More particularly, the word "exemplary" as used herein indicates one among several examples and it should be understood that no special emphasis, exclusivity, or preference, is associated or implied by the use of this word.

Generally, in accordance with the various illustrative embodiments disclosed herein, a system can include a master oscilloscope that transmits a slave signal to one or more slave oscilloscopes. In one exemplary implementation, the slave signal includes a synchronized trigger pulse and a timing interpolation parameter. The synchronized trigger pulse is used in the master oscilloscope to provide a display of a first input signal on a display screen of the master oscilloscope and the timing interpolation parameter indicates a timing delay that is applied in the master oscilloscope with respect to the synchronized trigger pulse when providing the display on the display screen. A slave oscilloscope can use the synchronized trigger pulse and the timing interpolation parameter to provide a display of a second input signal on a display screen of the slave oscilloscope, thereby ensuring that a triggered edge of the second input signal is time-aligned with a triggered edge of the first input signal. This technique provides various advantages in terms of reducing and/or eliminating absolute timing uncertainties as well as relative timing uncertainties when observing one or both of the first input signal displayed on the display screen of the master oscilloscope and the second input signal displayed on the display screen of the slave oscilloscope.

Figure 1:
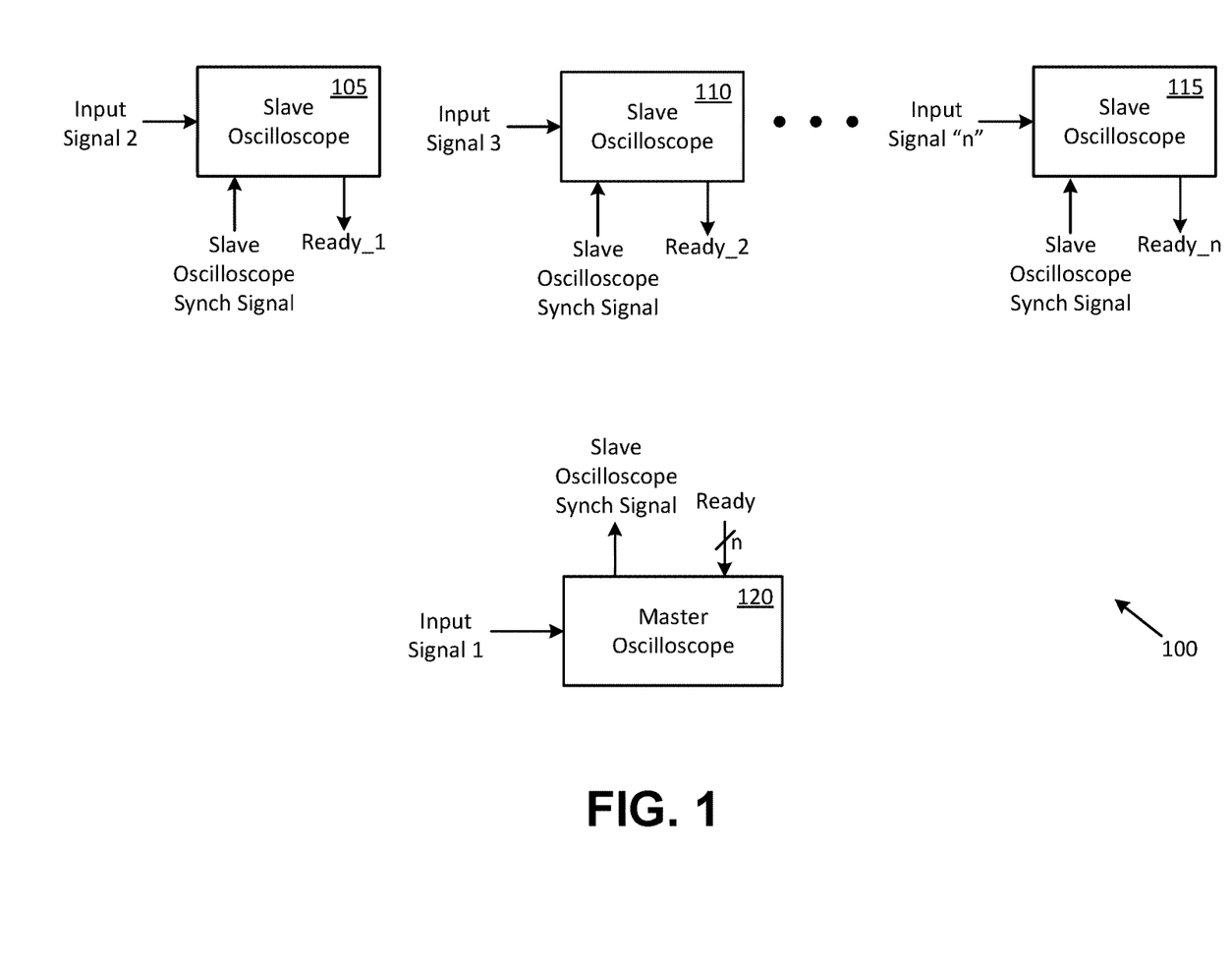
FIG. 1 shows a system that includes a master oscilloscope coupled to several slave oscilloscopes in accordance with an exemplary embodiment of the present invention.

Attention is now drawn to FIG. 1 which illustrates an exemplary system 100 that includes a master oscilloscope 120 coupled to "n" slave oscilloscopes (n≥1) in an arrangement that allows for a synchronized display of various signals on respective display screens of the master oscilloscope 120 and the "n" slave oscilloscopes, in accordance with an exemplary embodiment of the present invention. The master oscilloscope 120 can be a digital oscilloscope that is used to receive and process an input signal 1 for display upon a display screen of the master oscilloscope 120. The slave oscilloscope 105 can be a digital oscilloscope that is used to receive and process an input signal 2 for display upon a display screen of the slave oscilloscope 105, the slave oscilloscope 110 can be a digital oscilloscope that is used to receive and process an input signal 3 for display upon a display screen of the slave oscilloscope 110, and the slave oscilloscope 115 can be a digital oscilloscope that is used to receive and process an input signal "n" for display upon a display screen of the slave oscilloscope 115. The various input signals that are received in the various oscilloscopes can be related to one another in some way or can be completely unrelated signals.

Irrespective of the nature of the input signals, a user of the system 100 may desire, for example, to observe certain timing relationships between the various input signals. Towards this end, it is desirable that each of the various input signals be triggered for display substantially simultaneously on all the oscilloscopes. Doing so, enables the user to not only observe an input signal in an individual manner for evaluating absolute signal characteristics of the input signal, but can also observe two or more input signals in a comparative manner for evaluating relative signal characteristics between various input signals. This can be carried out by the master oscilloscope 120 transmitting a slave oscilloscope synchronization signal to each of the "n" slave oscilloscopes. The format of the slave oscilloscope synchronization signal, as well as the transmission medium used for transmitting the slave oscilloscope synchronization signal, can be selected on the basis of various applications. Thus, in one application, the slave oscilloscope synchronization signal can be formatted and transmitted in a wireless format, in another application, the slave oscilloscope synchronization signal can be formatted and transmitted in an optical format, and in yet another application, the slave oscilloscope synchronization signal can be formatted and transmitted in a wired format.

In an exemplary embodiment in accordance with the present invention, two or more of the slave oscilloscopes in the exemplary system 100 can be identical, similar, or different with respect to each other and/or with respect to the master oscilloscope 120. For example, slave oscilloscope 105 can be a wide bandwidth digital oscilloscope that can capture and display an input signal very fast, whereas slave oscilloscope 110 can be a digital storage oscilloscope that requires a certain amount of time to capture and store an input signal before providing a display. Consequently, it may be impractical for the master oscilloscope 120 to arbitrarily transmit the slave oscilloscope synchronization signal to the slave oscilloscopes without taking into consideration that the slave oscilloscope 110 may not be ready to use the slave oscilloscope synchronization signal at the same time as the slave oscilloscope 105. A handshaking signal arrangement can be used to address such a condition.

In one example implementation, the handshaking signal arrangement is carried out by each of the "n" slave oscilloscopes transmitting a ready signal to the master oscilloscope 120. The master oscilloscope 120 waits to receive the "n" ready signals from the "n" slave oscilloscopes before using an arm signal to generate various trigger signals as described below in more detail. In another example implementation, the master oscilloscope 120 can poll each of the "n" slave oscilloscopes to ensure that all "n" slave oscilloscopes are armed and ready to receive the slave oscilloscope synchronization signal, before transmitting the slave oscilloscope synchronization signal to all the slave oscilloscopes. In a variant of this implementation, the master oscilloscope 120 may opt to transmit the slave oscilloscope synchronization signal only to those slave oscilloscopes that are ready to receive the slave oscilloscope synchronization signal and ignore those slave oscilloscopes that are not ready to receive the slave oscilloscope synchronization signal. In this scenario, the input signals displayed on the ignored slave oscilloscopes may not be time-aligned with the input signal displayed on the master oscilloscope 120 and the slave oscilloscopes that have received the slave oscilloscope synchronization signal.

Figure 2:
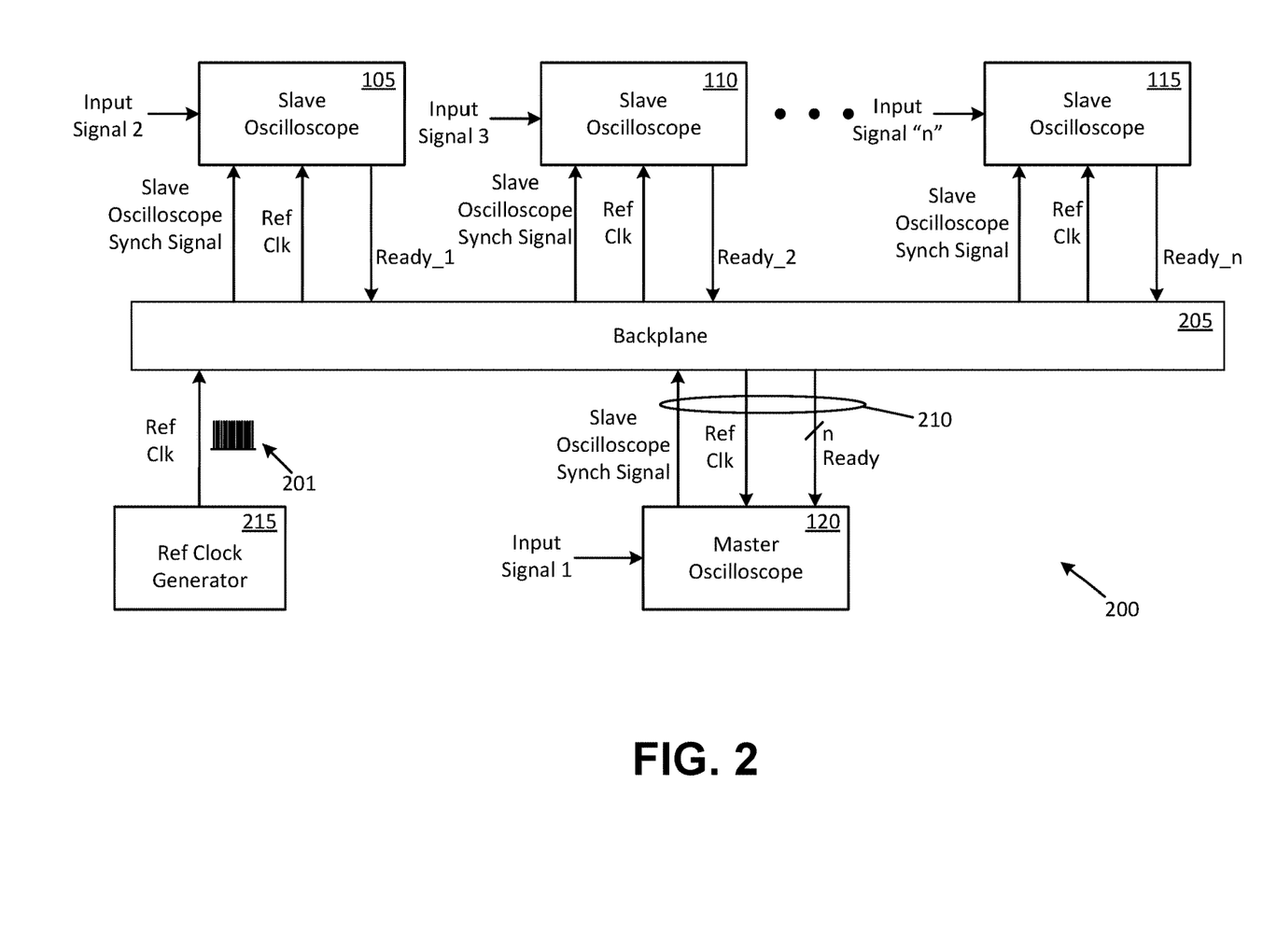
FIG. 2 shows another system that includes a master oscilloscope coupled to several slave oscilloscopes via a backplane in accordance with an exemplary embodiment of the present invention.

Attention is next drawn to FIG. 2, which illustrates an exemplary system 200 in which the master oscilloscope 120 is coupled to the "n" slave oscilloscopes (n≥1) via a backplane 205. In this example, the slave oscilloscope synchronization signal and the handshaking signals are propagated via a specific transmission medium—a printed circuit board that is operative as the backplane 205 in a system having plug-in printed circuit boards. One or more of the "n" slave oscilloscopes can be provided in the form of plug-in printed circuit boards (oscilloscope plug-in modules) that are plugged into connectors (not shown) in the backplane 205. The master oscilloscope 120 can also be a plug-in printed circuit board that is plugged into the backplane 205 or can be a standalone unit that provides the slave oscilloscope synchronization signal and the handshaking signals to the backplane 205 via a coaxial cable 210, for example.

Furthermore, in this exemplary system 200, a reference clock generator 215 can be used to generate one or more clocks, such as a reference clock 201 that is provided to the "n" slave oscilloscopes as well as to the master oscilloscope 120. The reference clock generator 215 can be a plug-in printed circuit board that is plugged into a connector in the backplane 205 or can be a part of one or more of the "n" slave oscilloscopes and/or the master oscilloscope 120.

The plug-in printed circuit boards as well as the backplane 205 typically incorporate metallic tracks that are used to propagate various signals such as the clock signals and the slave signal disclosed herein. The metallic tracks and the material of the printed circuit boards place certain limitations upon these various signals, such as the maximum pulse rate, maximum transmission frequency, and signal distortions/interferences that can be introduced into the signals due to cross-talk, electro-magnetic interference (EMI) etc. Consequently, it is undesirable and/or impractical in some implementations to transmit certain signals such as a high frequency clock signal via the backplane 205. This limitation can be overcome by down-converting the frequency of such signals at a transmission end (in a plug-in printed circuit board, for example) before transmitting the down-converted signals through the backplane 205. The down-converted signals can be up-converted in frequency at the receiving end (in another plug-in printed circuit board, for example). Some exemplary implementations that use this approach are described below using other figures.

Figure 3:
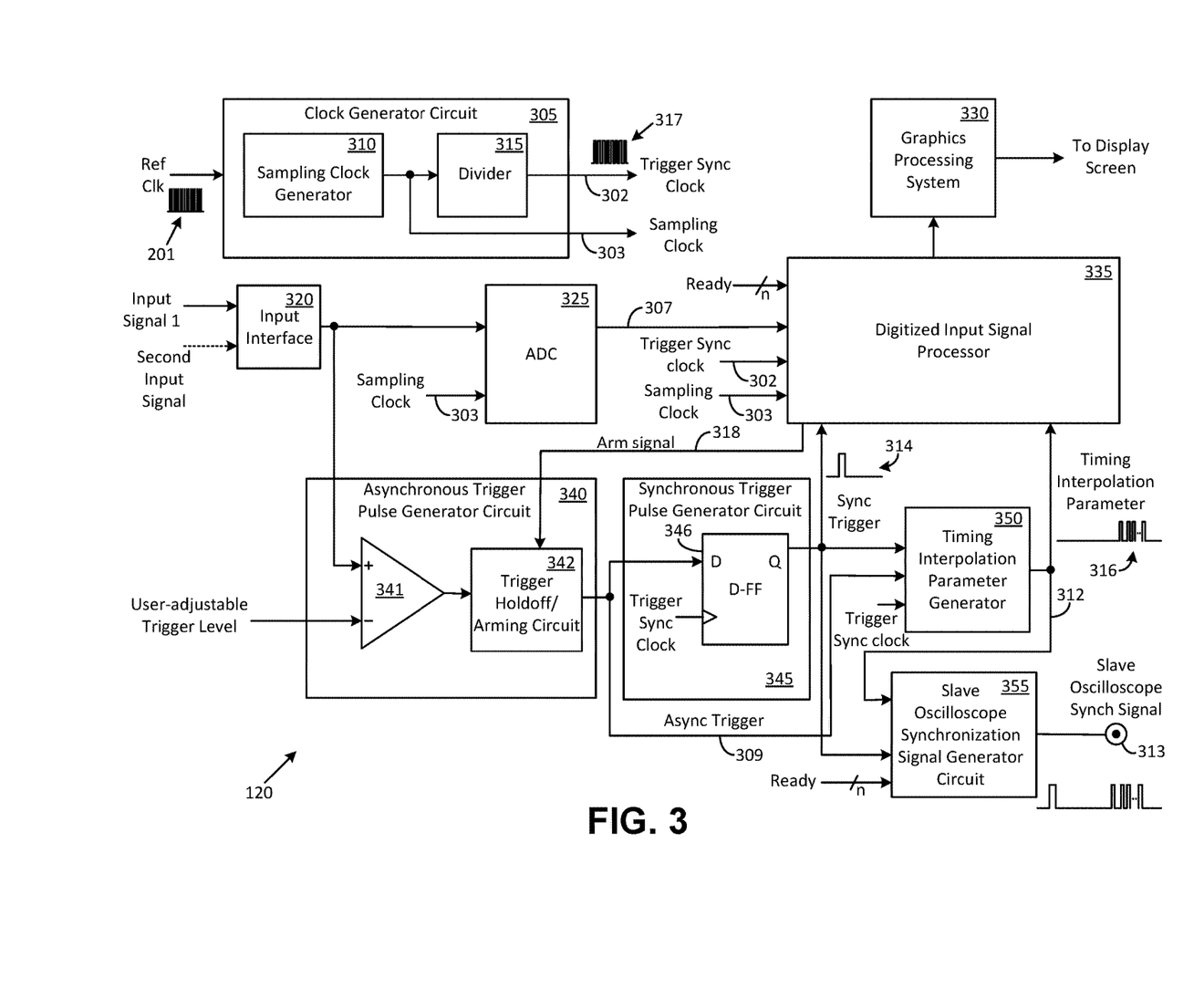
FIG. 3 shows some functional blocks of a master oscilloscope in accordance with an exemplary embodiment of the present invention.

FIG. 3 shows some functional blocks of the master oscilloscope 120 in accordance with an exemplary embodiment of the present invention. The master oscilloscope 120 can include a clock generator circuit 305 that receives the reference clock 201 (from the reference clock generator 215 for example) and uses the reference clock 201 to generate various clocks that can be used in the master oscilloscope 120. These various clocks can include a trigger synchronization clock 317 and a sampling clock that are generated by using a sampling clock generator 310 and a divider 315 for example. The trigger synchronization clock 317 is coupled via a line 302 to various functional elements in the master oscilloscope 120. The sampling clock is similarly coupled via a line 303 to various functional elements in the master oscilloscope 120. The master oscilloscope 120 can also include an input interface 320 for receiving an input signal that a user desires to observe on a display screen of the master oscilloscope 120. The user typically provides the input signal (an analog input signal for example) through an input coupler (not shown) on the master oscilloscope 120. The master oscilloscope 120 can include more than one input coupler such as a second input coupler that the user can use to provide a second input signal for observing on the display screen of the master oscilloscope 120. In some multichannel oscilloscopes, several more input signals can be coupled into the input interface 320 via a number of input couplers.

The output of the input interface 320 is provided to an analog-to-digital converter (ADC) 325 and an asynchronous trigger pulse generator circuit 340. The ADC 325 uses the sampling clock to convert this output into a stream of digital bits that are coupled (via a line 307) into a digitized input signal processor 335. The digitized input signal processor 335 uses various clock signals (such as the sampling clock and the trigger synchronization clock) and other signals (that will be described below in further detail) to generate data that is provided to a graphics processing system 330. The graphics processing system 330 uses the data to generate driver signals that are provided to a display screen for displaying a waveform that represents the input signal.

The asynchronous trigger pulse generator circuit 340 includes a comparator 341 that compares the input signal (provided by the input interface 320) against a user-adjustable trigger level in order to generate an asynchronous trigger pulse whenever an amplitude of the input signal exceeds the user-adjustable trigger level. The user-adjustable trigger level is typically set by the user using a trigger control knob or executing a soft-key operation via the front panel of the master oscilloscope 120. The output of the comparator 341 is coupled into a trigger holdoff/arming circuit 342. The trigger holdoff/arming circuit 342 can be used for various purposes such as for setting a trigger holdoff period and/or a trigger arming condition. The trigger holdoff/arming circuit 342 can also be used to propagate the asynchronous trigger pulse to the synchronous trigger pulse generator circuit 345 subject to receiving the arm signal from the digitized input signal processor 335. Typically, the digitized input signal processor 335 transmits the arm signal (via a line 318) to the trigger holdoff/arming circuit 342 after the master oscilloscope 120 has received the "n" ready signals from the "n" slave oscilloscopes (as described above). Such a procedure ensures that the slave oscilloscope synchronization signal is transmitted to the "n" slave oscilloscopes and processed by the "n" slave oscilloscopes at substantially the same instant as the master oscilloscope processes the synchronized trigger pulse 314 and the timing interpolation parameter 316. The use of the arm signal is repeated for subsequent triggering cycles.

It may be pertinent to point out that the asynchronous trigger pulse generator circuit 340 does not use any of the clocks generated in the clock generator circuit. Consequently, the asynchronous trigger pulse generated by the asynchronous trigger pulse generator circuit 340 bears no timing relationship to the various clocks in the master oscilloscope 120. Any coincidence between a transitioning edge of the asynchronous trigger pulse and a transitioning edge of clock signal is purely coincidental in nature. However, in some exemplary implementations, the asynchronous trigger pulse generator circuit 340 can include circuitry that utilizes a clock (generated by the clock generator circuit 305) in order to provide time alignment between a transitioning edge of the asynchronous trigger pulse output generated by the trigger holdoff/arming circuit 342 and a transitioning edge of the input signal provided by the input interface 320 to the comparator 341.

The asynchronous trigger pulse generated by the asynchronous trigger pulse generator circuit 340 is coupled via line 309 into a synchronous trigger pulse generator circuit 345 and also into a timing interpolation parameter generator 350. The synchronous trigger pulse generator circuit 345 synchronizes the asynchronous trigger pulse with a clock provided by the clock generator circuit 305 and produces a synchronized trigger pulse 314. In the example circuit shown, the synchronous trigger pulse generator circuit 345 can include a D flip-flop 346 that has the asynchronous trigger pulse coupled into the D-input and clocked by the trigger synchronization clock 317. The output of the D flip-flop 346 (either the Q output or the Q' output) is the synchronized trigger pulse 314 having a transition edge that is substantially aligned with a transition edge of the trigger synchronization clock 317. The transition edge of the synchronized trigger pulse 314 will occur only when a logic level is present at the D input (a logic 1 level, in this example configuration). The logic level is clocked out through the D flip-flop 346 and into the line 311 by a transitioning edge of the trigger synchronization clock 317 (a rising edge, in this example configuration). Consequently, a transitioning edge of the synchronized trigger pulse as 314 at the output of the D flip-flop 346 will never coincide with a transitioning edge of the asynchronous trigger pulse coupled into the D-input. The delay between the transitioning edge of the synchronized trigger pulse 314 at the output of the D flip-flop 346 and the transitioning edge of the asynchronous trigger pulse coupled into the D-input is quantified in a timing interpolation parameter generator 350 where the delay period is detected for generating a timing interpolation parameter 316 in accordance with an exemplary implementation of the present invention. The timing interpolation parameter 316 can be generally described as a parameter that provides a quantitative measure of the delay between a transitioning edge of the asynchronous trigger pulse and a transitioning edge of the synchronized trigger pulse 314 in the master oscilloscope 120. In some example embodiments, the timing interpolation parameter 316 can be a numerical value that is indicative of the time delay.

In this exemplary embodiment, the timing interpolation parameter 316 is generated in the timing interpolation parameter generator 350 by using a combination of the synchronized trigger pulse 314, the asynchronous trigger pulse, and the trigger synchronization clock 317. The generated timing interpolation parameter 316 is provided via a line 312 to the digitized input signal processor 335 and to a slave oscilloscope synchronization signal generator circuit 355. The slave oscilloscope synchronization signal generator circuit 355 uses the timing interpolation parameter 316 and the synchronized trigger pulse 314 to generate a slave signal that is provided to the "n" slave oscilloscopes via an output port 313 after receiving the "n" ready signals from the "n" slave oscilloscopes.

In one exemplary embodiment, the output port 313 can be located in a standalone implementation of the master oscilloscope 120 and a communication link (wired link, optical link, wireless link etc.) can be used to couple the slave signal from the output port 313 to one or more input ports of one or more of the "n" slave oscilloscopes. One or more of the "n" slave oscilloscopes can be other standalone units and/or can be plug-in modules located in a rack system having the backplane 205. In another exemplary embodiment, the output port 313 can be one or more pins of a connector in a plug-in printed circuit board implementation of the master oscilloscope 120. The slave signal can be propagated through the backplane 205 to the "n" slave oscilloscope plug-in printed circuit boards.

The digitized input signal processor 335 confirms that the "n" slave oscilloscopes are in a ready state (via the "n" ready lines) before using the timing interpolation parameter 316 to apply a delay to the synchronized trigger pulse 314 when generating a display on the display screen of the master oscilloscope 120. The use of the timing interpolation parameter 316 in the digitized input signal processor 335 is directed at ensuring that triggering a display of the input signal 1 on the display screen of the master oscilloscope 120 is executed at substantially the same instant as triggering of a display of the respective input signals on the display screens of the "n" slave oscilloscopes.

Figure 4:
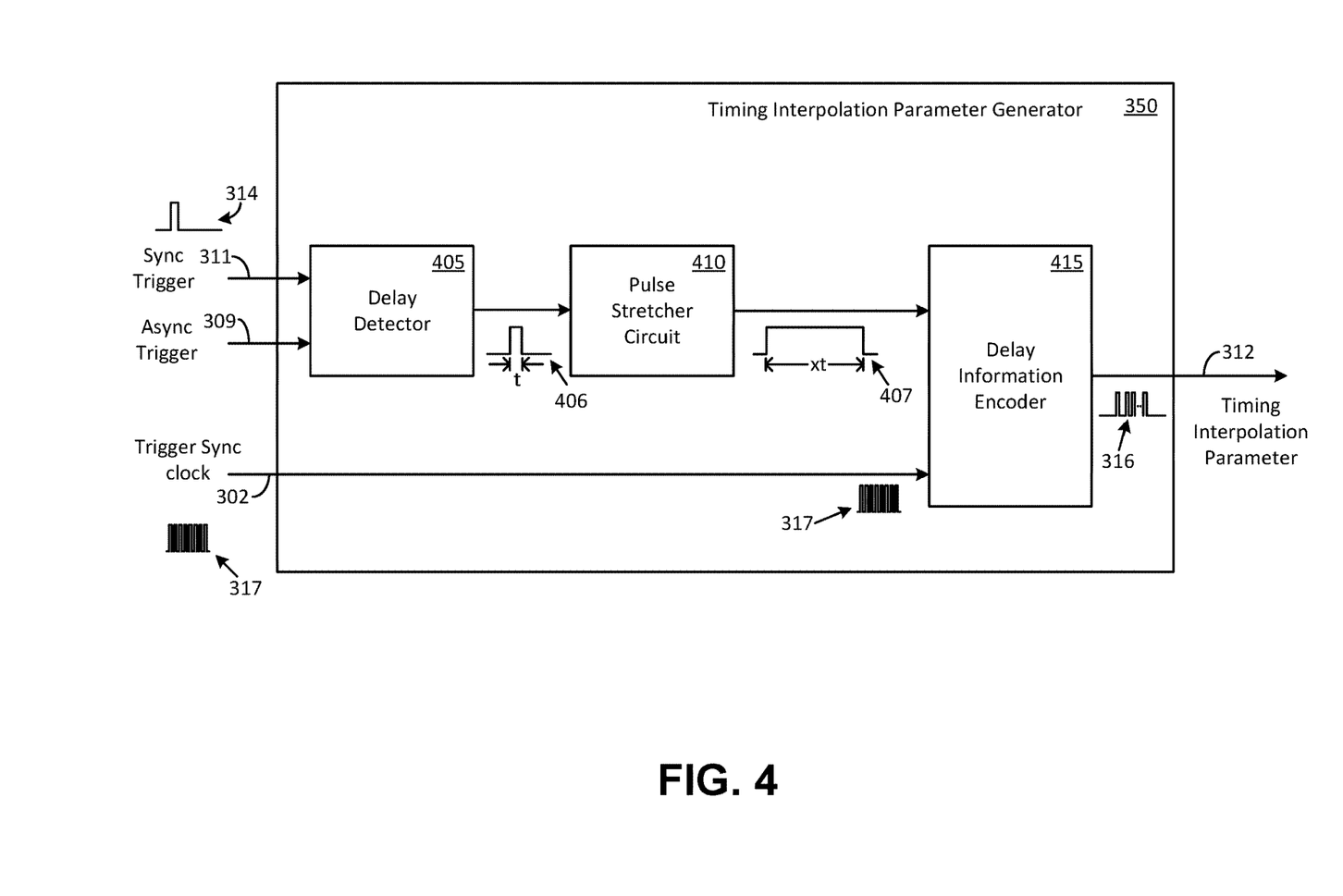
FIG. 4 shows some functional blocks in an exemplary implementation of a timing interpolation parameter generator that can be a part of the master oscilloscope shown in FIG. 3.

FIG. 4 shows some functional blocks in an exemplary implementation of the timing interpolation parameter generator 350 that can be a part of the master oscilloscope 120. In this exemplary implementation, the timing interpolation parameter generator 350 receives the synchronized trigger pulse 314 generated in the synchronous trigger pulse generator circuit 345, the asynchronous trigger pulse generated in the asynchronous trigger pulse generator circuit 340, and the trigger synchronization clock 317 generated in the clock generator circuit 305. A delay detector 405, which can include elements such as one or more edge-triggered flip-flops and/or logic gates, outputs a first time delay indicator pulse 406 having a pulse width "t" that indicates the time delay between the synchronized trigger pulse 314 and the asynchronous trigger pulse. The first delay indicator pulse 406 can have a narrow width in some implementations (a few nanoseconds, for example) and may be cumbersome or challenging to quantify when forming the timing interpolation parameter 316. Consequently, a pulse stretcher circuit 410 can be used to stretch the first delay indicator pulse 406 and generate a second delay indicator pulse 407 having a pulse width "xt". The pulse stretching parameter "x" in "xt" can be obtained by using various types of circuitry in the pulse stretcher circuit 410. In one example implementation, an analog charging circuit having a predefined charge-discharge characteristic (using reactive components such as capacitors and inductors, for example) can be used for this purpose. In such an arrangement, a leading edge of the first delay indicator pulse 406 initiates a charging cycle while the trailing edge of the first delay indicator pulse 406 initiates a discharging cycle. The output of the analog charging circuit can be coupled into a D flip-flop in order to obtain the second delay indicator pulse 407 having the wider pulse width. In one example implementation, the pulse width "xt" of the second delay indicator pulse 407 can be based on the duration of the discharging cycle, which can be tailored accordingly. The second delay indicator pulse 407 is coupled into a delay information encoder 415 that produces the timing interpolation parameter 316 by using the second delay indicator pulse 407 and the trigger synchronization clock 317 as described below.

Figure 5:
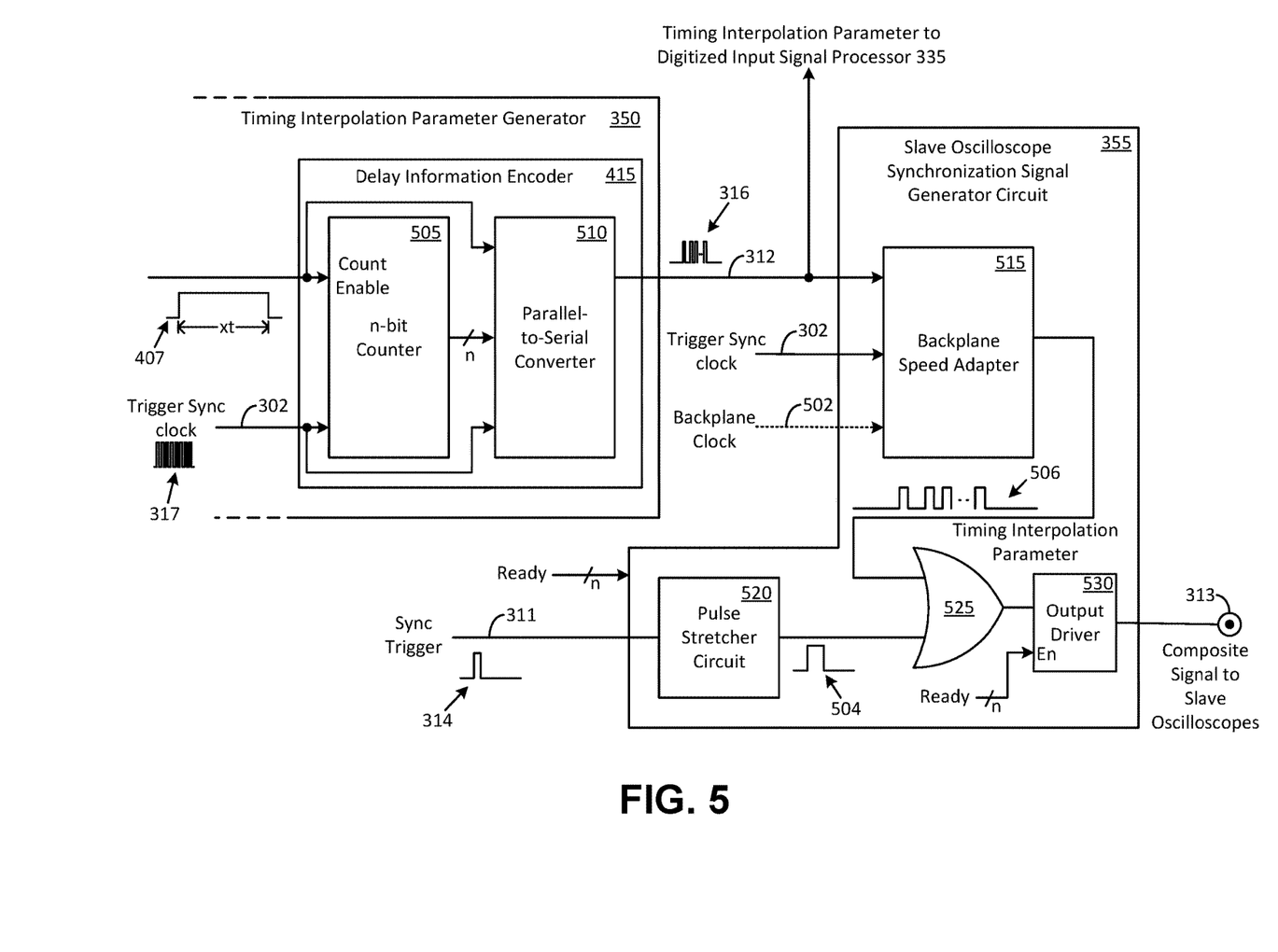
FIG. 5 shows functional blocks that can be included in an exemplary timing interpolation parameter generator and an exemplary slave oscilloscope synchronization signal generator circuit of the master oscilloscope shown in FIG. 3.

FIG. 5 shows functional blocks that can be included in the delay information encoder 415 and the slave oscilloscope synchronization signal generator circuit 355 of the master oscilloscope 120 in accordance with an exemplary implementation of the present invention. In this exemplary implementation, the delay information encoder 415 includes an n-bit counter 505 (n>1) and a parallel-to-serial converter 510. The second delay indicator pulse 407 generated by the pulse stretcher circuit 410 provides a gating function by operating as a count enable input to the n-bit counter 505 when the n-bit counter 505 counts a number of clock cycles of the trigger synchronization clock 317 that corresponds to the second delay indicator pulse 407. The n-bit parallel output of the n-bit counter 505 thus provides a quantitative representation of the width of the second delay indicator pulse 407. For example, when the trigger synchronization clock 317 has a frequency of 156.25 MHz (6.4 ns period) and the second delay indicator pulse 407 has a pulse width of 60 μs, the n-bit parallel output of the n-bit counter 505 will indicate a clock cycles count of 93,750 (600 μs/6.4 ns). In this example, the clock cycles count of 93,750 operates as a numerical representation of the delay between a transition edge of the synchronized trigger pulse 314 and a transition edge of the asynchronous trigger pulse in the master oscilloscope 120. The parallel-to-serial converter 510 converts the n-bit parallel output of the n-bit counter 505 into a serial output that constitutes the timing interpolation parameter 316. A slave oscilloscope can use the timing interpolation parameter 316 and a trigger synchronization clock of frequency 156.25 MHz to determine the delay being used in the master oscilloscope 120.

The backplane 205 used in some example implementations may not have an adequate bandwidth to support propagating the timing interpolation parameter 316 at the clock rate used by the parallel-to-serial converter 510. Consequently, the slave oscilloscope synchronization signal generator circuit 355 can include a backplane speed adapter 515 that down-converts the timing interpolation parameter 316 to a timing interpolation parameter 506 having a propagation rate that is supported by the backplane 205. The backplane speed adapter 515 can be implemented in different ways such as by using one or more registers (first-in-first-out registers arranged in an elastic storage configuration, for example). The registers can be clocked by the trigger synchronization clock 317 and can be additionally clocked where so desired, by a backplane clock via a line 502. The backplane clock can be asynchronous to the trigger synchronization clock 317 in some example embodiments.

The slave oscilloscope synchronization signal generator circuit 355 can also include a pulse stretcher circuit 520 that expands a pulse width of the synchronized trigger pulse 314 to produce a synchronized trigger pulse 504 having a pulse width characteristic suitable for propagation through the backplane 205. The pulse stretcher circuit 520 can use the trigger synchronization clock 317 to execute this function.

The synchronized trigger pulse 504 provided by the pulse stretcher circuit 520 is combined with the timing interpolation parameter 506 provided by the backplane speed adapter 515 in a combiner circuit. In this example implementation, the combiner circuit is implemented in the form of an OR gate 525, which constitutes an asynchronous element. In other implementations, the combiner circuit can incorporate synchronous logic elements such as registers and flip-flops in lieu of or in addition to asynchronous logic elements.

The combination of the synchronized trigger pulse 504 and the timing interpolation parameter 506 is the slave signal that is transmitted via the backplane 205 in a serial transmission format. In this example implementation, the slave signal is a composite signal that is driven into the backplane 205 via the output port 313 by using an output driver circuit 530. The output driver circuit 530 can be enabled by the "n" ready signals originated by the "n" slave oscilloscopes. This arrangement ensures that the master oscilloscope 120 transmits the composite signal to the slave oscilloscopes in a manner that allows the one or more input signals coupled into the master oscilloscope 120 and one or more signals coupled into the slave oscilloscopes to be triggered at a substantially identical instant. In other example implementations, other circuits such as a controller (not shown) in the master oscilloscope 120 can be used to receive the "n" ready signals and determine generation and/or propagation of the various signals such as the synchronized trigger pulse 504 and the timing interpolation parameter 506.

Figure 6:
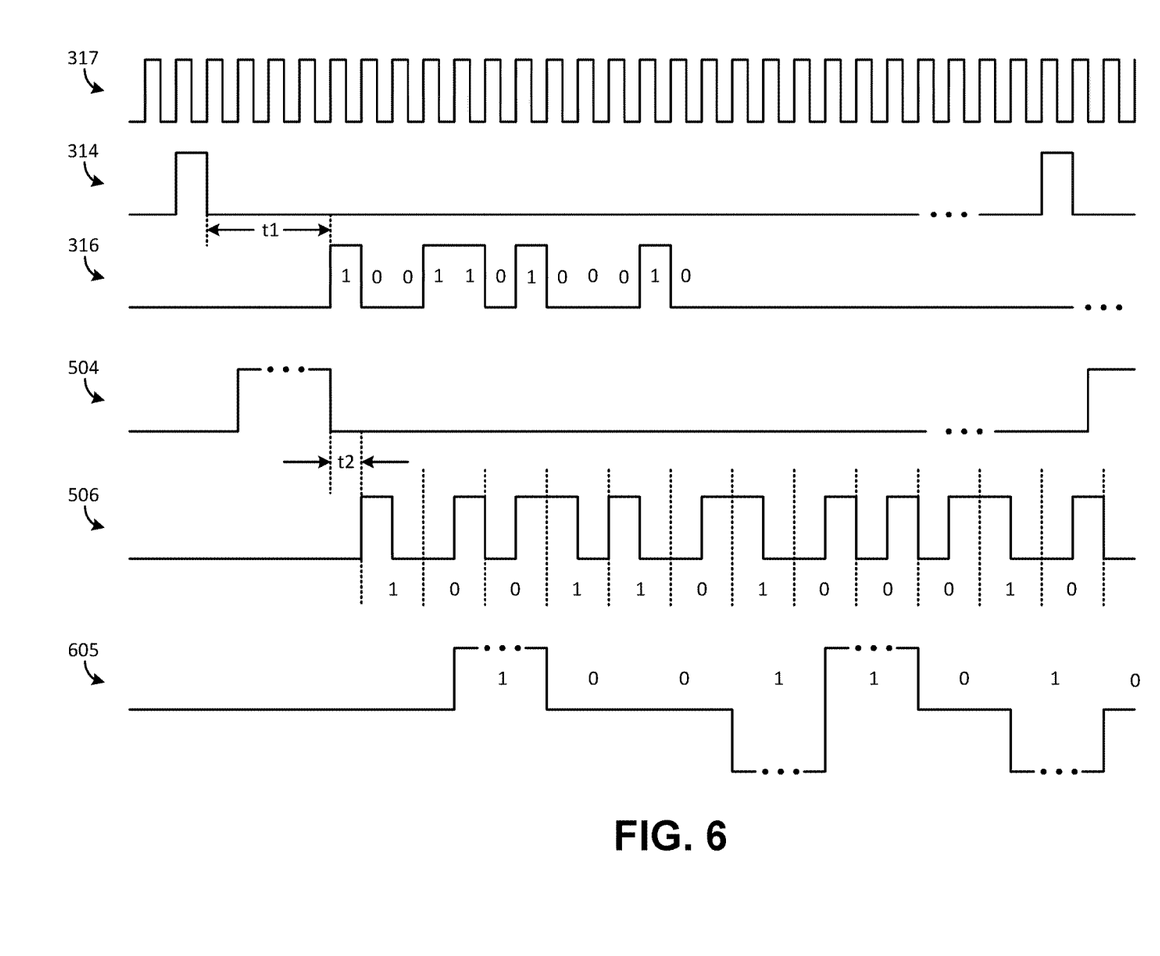
FIG. 6 illustrates some waveforms associated with a slave signal transmitted by a master oscilloscope to one or more slave oscilloscopes in accordance with one or more exemplary embodiments of the present invention.

FIG. 6 illustrates some waveforms associated with a slave signal, more particularly, a composite slave signal that is transmitted by the master oscilloscope 120 to one or more slave oscilloscopes in accordance with an exemplary embodiment of the present invention. The synchronized trigger pulse 314 and the timing interpolation parameter 316 operate at a pulse repetition rate that is determined by the trigger synchronization clock 317. Attention is drawn to a delay period "t1" between a trailing edge of the synchronized trigger pulse 314 and a leading edge of a first pulse of the timing interpolation parameter 316. The delay period can be attributed to the delay information encoder 415 where the parallel output of the n-bit counter 505 is converted into a serial format only after the counting has been completed in accordance with the trailing edge of the second delay indicator pulse 407. In this exemplary implementation, the n-bit counter 505 in the delay information encoder 415 can be a 12-bit counter and the timing interpolation parameter 316 consequently has a 12-bit binary format.

The synchronized trigger pulse 504 has a pulse width that is wider than the pulse width of the synchronized trigger pulse 314 and is selected based on one or more considerations for propagation through the backplane 205. The pulse width of the synchronized trigger pulse 504 is mainly defined by the pulse stretcher circuit 520 described above. Each of the pulses of the timing interpolation parameter 506 also has a pulse width that is selected based on one or more considerations for propagation through the backplane 205. The pulse width is mainly defined by the backplane speed adapter 515 described above. The delay period "t2" between the trailing edge of the synchronized trigger pulse 504 and the leading edge of the first pulse in the timing interpolation parameter 506 can be different than the delay period "t1." For example, "t2" can be greater than "t1" and can be selected based on one or more considerations for propagation through the backplane 205 and/or on other considerations such as signal processing characteristics of a slave oscilloscope.

In one or more exemplary implementations in accordance with the present invention, the binary bits of the timing interpolation parameter 506 can be encoded using various modulation formats such as amplitude modulation formats and phase modulation formats (phase shift keying (PSK), coded mark inversion (CMI), non-return to zero (NRZ), bipolar eight zero suppression (B8ZS), and high density bipolar three zeros (HDB3), for example). The PSK format is used in the timing interpolation parameter 506 shown in FIG. 6. Another example of a modulation format that can be used for propagating the timing interpolation parameter 506 through the backplane 205 is an alternating mark inversion (AMI) format that is shown in the timing interpolation parameter 605 representation in FIG. 6.

Figure 7:
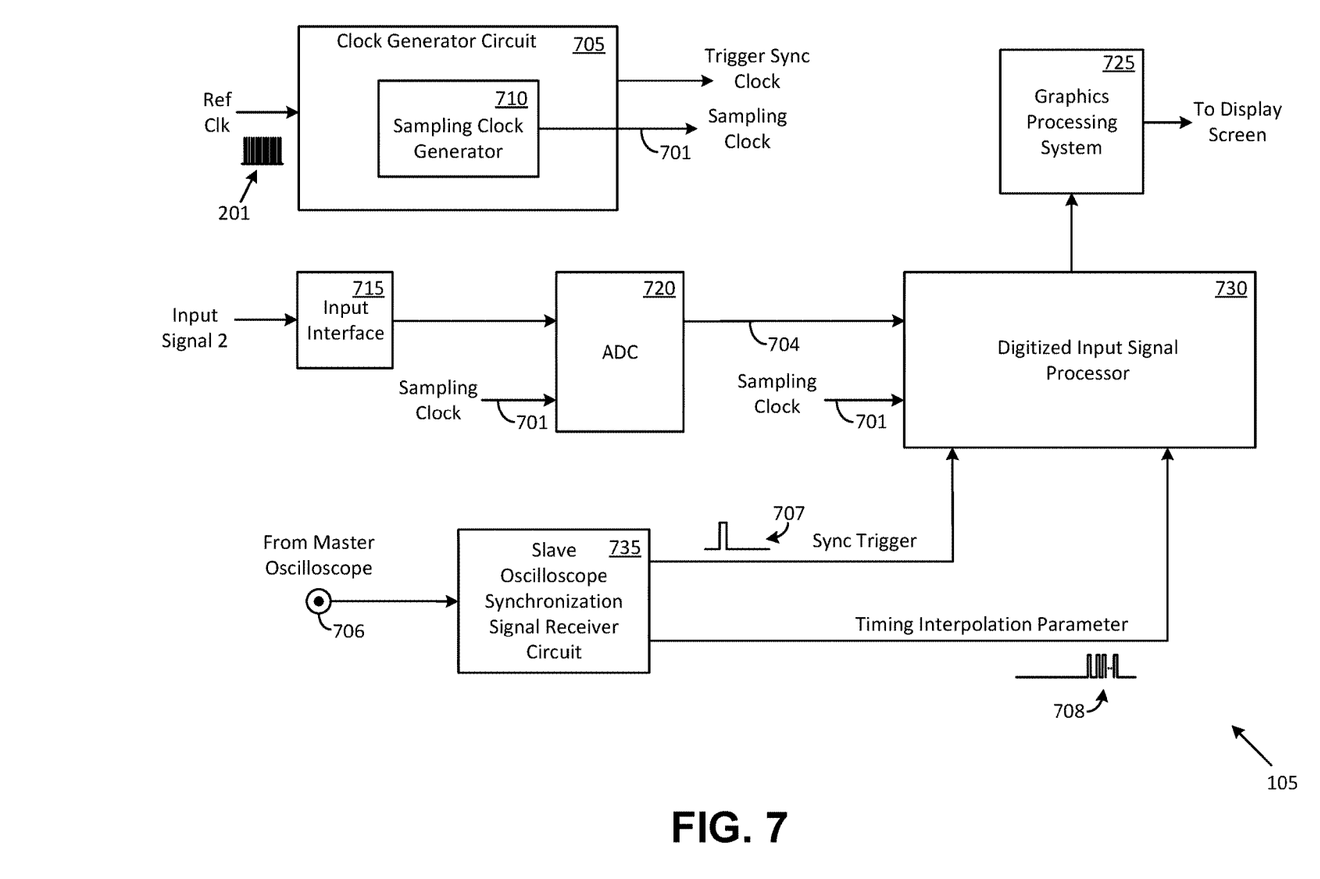
FIG. 7 shows some functional blocks of a slave oscilloscope that can be coupled to a master oscilloscope in accordance with an exemplary embodiment of the present invention.

FIG. 7 shows some functional blocks of the slave oscilloscope 105 that can be coupled to the master oscilloscope 120 in accordance with an exemplary embodiment of the present invention. It must be understood that the description provided below with respect to the slave oscilloscope 105 is equally applicable to any of the other slave oscilloscopes shown in FIGS. 1 and 2. In this exemplary embodiment, the slave oscilloscope 105 includes a clock generator circuit 705 that receives the reference clock 201 that is used in the master oscilloscope 120 and uses the reference clock 201 to generate one or more clocks such as a trigger synchronization clock and a sampling clock. The sampling clock that is generated in a sampling clock generator 710 is coupled via a line 701 to various functional elements in the slave oscilloscope 105. The use of the reference clock 201 in the slave oscilloscope 105 ensures that transition edges in various signals in both the master oscilloscope 120 and the slave oscilloscope 105 are synchronous with each other.

The slave oscilloscope 105 can also include an input interface 715 that receives an input signal that a user desires to observe on a display screen of the slave oscilloscope 105. The input signal is provided through an input coupler (not shown) on the slave oscilloscope 105. The slave oscilloscope 105 can include more than one input coupler such as a second input coupler that the user can use to provide a second input signal for observing on the display screen of the slave oscilloscope 105. In some multichannel oscilloscopes, several more input signals can be coupled into the input interface 715 via a number of input couplers.

The output signal from the input interface 715 is provided to an analog-to-digital converter (ADC) 720. The ADC 720 uses the sampling clock to convert this signal, which can be an analog input signal, into a stream of digital bits that are coupled (via a line 704) into a digitized input signal processor 730. The digitized input signal processor 730 can, in some exemplary implementations, be substantially similar to the digitized input signal processor 335 used in the master oscilloscope 120. The digitized input signal processor 730 uses the sampling clock and various other clock signals (not shown) to process a synchronized trigger pulse 707 and a timing interpolation parameter 708 and generate data that is provided to a graphics processing system 725. The graphics processing system 725 generates driver signals that are coupled into a display screen for displaying a waveform that represents the input signal 2 coupled into the slave oscilloscope 105.

The slave oscilloscope synchronization signal receiver circuit 735 receives a slave oscilloscope synchronization signal from the master oscilloscope 120 via a port 706. In an exemplary embodiment, the slave oscilloscope synchronization signal can be provided through the backplane 205 in the form of the composite signal that is driven into the backplane 205 via the output port 313 of the master oscilloscope 120. The slave oscilloscope synchronization signal receiver circuit 735 operates upon the slave oscilloscope synchronization signal and outputs the synchronized trigger pulse 707 and the timing interpolation parameter 708. Further details of the slave oscilloscope synchronization signal receiver circuit 735 are provided below.

Figure 8:
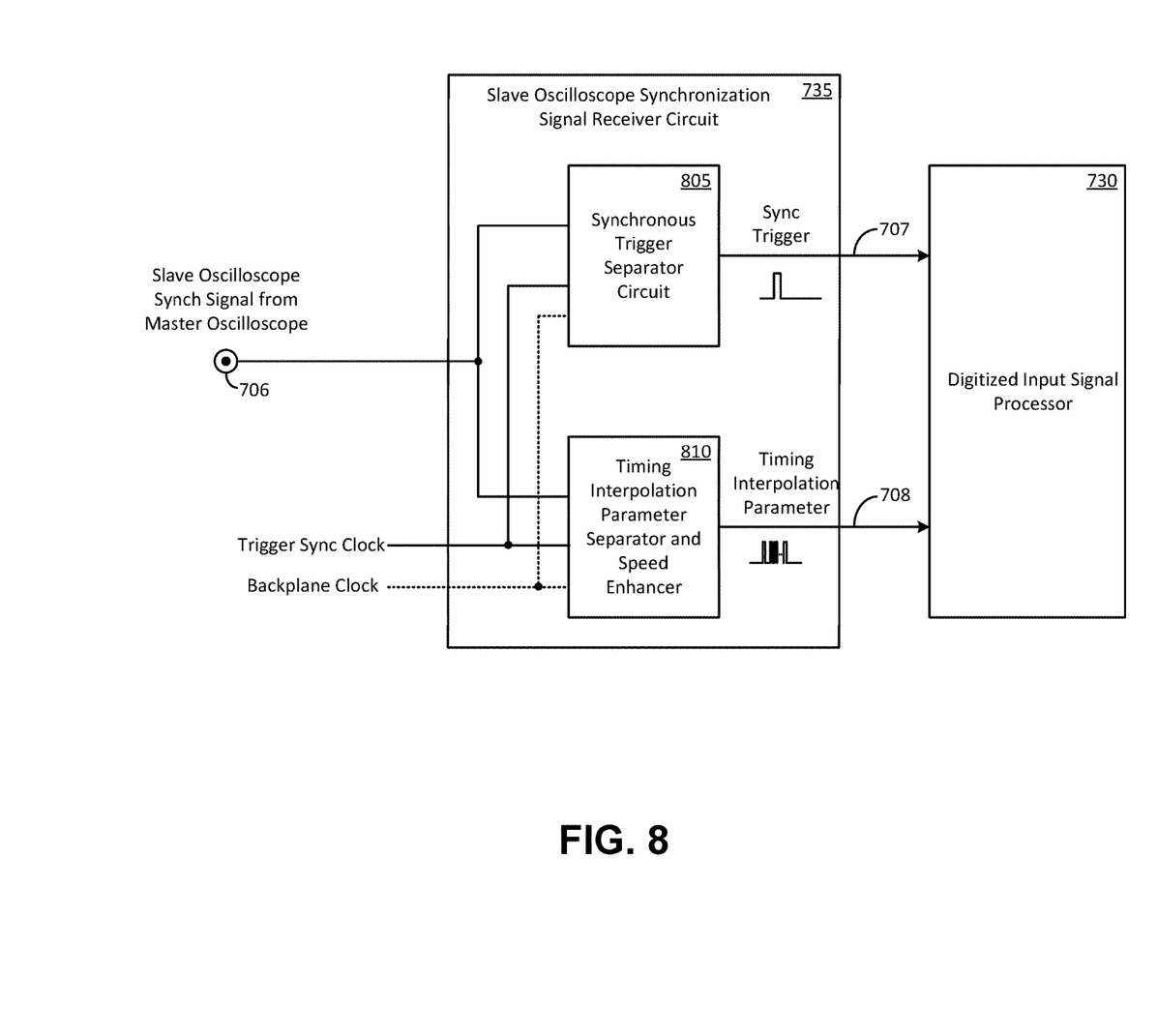
FIG. 8 shows some functional blocks in an exemplary implementation of a slave oscilloscope synchronization signal receiver circuit that can be a part of the slave oscilloscope shown in FIG. 7.

FIG. 8 shows some functional blocks in an exemplary implementation of the slave oscilloscope synchronization signal receiver circuit 735. In this exemplary implementation, the slave oscilloscope synchronization signal receiver circuit 735 includes two signal separator circuits—a synchronous trigger separator circuit 805 and a timing interpolation parameter separator and speed enhancer 810. The synchronous trigger separator circuit 805 can use clocks such as the trigger synchronization clock and a backplane clock to extract the synchronized trigger pulse 707. In some exemplary implementations, the backplane clock used in the slave oscilloscope 105 can be asynchronous with respect to the backplane clock used in the master oscilloscope 120 because the synchronous trigger separator circuit 805 can search for the synchronized trigger pulse 707 in the slave oscilloscope synchronization signal with apriori knowledge of the nature of the slave oscilloscope synchronization signal. The apriori knowledge can include for example knowledge of the number of bits used for the timing interpolation parameter. Thus, when the timing interpolation parameter contains 12 bits, the synchronous trigger separator circuit 805 can use timing characteristics of the trigger synchronization clock and/or the backplane clock to detect a time frame corresponding to a sequence of 13 bits (one bit corresponding to a current synchronized trigger pulse and 12 bits corresponding to the timing interpolation parameter) and conclude that the next incoming bit will correspond to a subsequent synchronized trigger pulse. The amount of time that can transpire between receiving the two synchronized trigger pulses can be fairly long as a result of a user taking time to set a user-adjustable trigger level that generates the asynchronous trigger pulse in the master oscilloscope 120 followed by observing a waveform on the display screen of the master oscilloscope 120 and possibly changing the user-adjustable trigger level for viewing another waveform later on.

The timing interpolation parameter separator and speed enhancer 810 can operate in a manner similar to that used in the synchronous trigger separator circuit 805 for identifying and isolating the timing interpolation parameter in the slave oscilloscope synchronization signal. When the slave oscilloscope synchronization signal is received via the backplane 205, the timing interpolation parameter separator and speed enhancer 810 can include speed enhancing circuitry, such as one or more first-in-first-out registers that shift in data bits using the backplane clock and shift out data bits using the trigger synchronization clock.

In summary, it should be noted that the invention has been described with reference to a few illustrative embodiments for the purpose of demonstrating the principles and concepts of the invention. It will be understood by persons of skill in the art, in view of the description provided herein, that the invention is not limited to these illustrative embodiments. Persons of skill in the art will understand that many such variations can be made to the illustrative embodiments without deviating from the scope of the invention.

The invention claimed is:
1. An oscilloscope comprising:
a first circuit that generates a first clock;

a second circuit that generates a first trigger signal by applying a trigger threshold to an input signal coupled into the oscilloscope;
a third circuit that generates a second trigger signal by using the first clock to synchronize the first trigger signal;
a fourth circuit that generates a timing interpolation parameter, the timing interpolation parameter providing a measure of a timing relationship between the first trigger signal and the second trigger signal;
a fifth circuit that generates a slave signal comprising the second trigger signal and the timing interpolation parameter; and
a sixth circuit that transmits the slave signal to an output port of the oscilloscope.

2. The oscilloscope of claim 1, further comprising:
at least one analog to digital converter that converts the input signal into digital data representing the input signal;
a seventh circuit configured to use the second trigger signal and the timing interpolation parameter to apply a timing characteristic upon the digital data representing the input signal; and
an eighth circuit configured to use the digital data having the timing characteristic to provide a visual representation of the input signal on a display screen of the oscilloscope.

3. The oscilloscope of claim 1, wherein the slave signal is a composite signal comprising the second trigger signal and the timing interpolation parameter, the composite signal transmitted in a serial transmission format.

4. The oscilloscope of claim 3, wherein the serial transmission format has a down-converted frequency for transmission through a printed circuit board.

5. The oscilloscope of claim 4, wherein the printed circuit board is a backplane configured to accommodate a plurality of plug-in modules, the plurality of plug-in modules including at least one oscilloscope plug-in module having an input port to receive the composite signal.

6. The oscilloscope of claim 1, wherein the timing interpolation parameter comprises a numerical value that represents a time delay between the first trigger signal and the second trigger signal.

7. The oscilloscope of claim 6, wherein the numerical value is a clock cycles count indicating a number of clock cycles of the first clock.

8. An oscilloscope comprising:
an input interface configured to receive an input signal coupled into the oscilloscope;
a first circuit configured to receive a first clock;
at least one analog to digital converter configured to convert the input signal into digital data representing the input signal;
a second circuit configured to receive a slave signal, the slave signal comprising a first trigger signal and a timing interpolation parameter, the timing interpolation parameter providing a measure of a timing relationship between the first trigger signal and a second trigger signal that is used elsewhere outside the oscilloscope;
a third circuit configured to use the first trigger signal and the timing interpolation parameter to apply a timing characteristic upon the digital data representing the input signal; and
a fourth circuit configured to use the digital data having the timing characteristic, to provide a visual representation of the input signal on a display screen of the oscilloscope.

9. The oscilloscope of claim 8, wherein the second trigger signal is used in a master oscilloscope, and the timing characteristic applied upon the digital data representing the input signal corresponds to a clock cycles count indicative of a time delay between the first trigger signal and the second trigger signal.

10. The oscilloscope of claim 9, wherein the clock cycles count corresponds to a number of clock cycles of a second clock used in the master oscilloscope.

11. The oscilloscope of claim 10, wherein the first clock received in the first circuit is the second clock used in the master oscilloscope.

12. The oscilloscope of claim 11, wherein the slave signal is a composite signal comprising the first trigger signal and the timing interpolation parameter, the composite signal having a transmission frequency that is different than a frequency of the second clock used in the master oscilloscope.

13. The oscilloscope of claim 12, wherein the second circuit comprises one or more signal separator circuits that separate the first trigger signal from the timing interpolation parameter in the composite signal.

14. A method comprising:
coupling a first input signal into a first oscilloscope;
generating a first trigger signal based in part on using the first input signal;
generating a second trigger signal by applying a first clock to the first trigger signal;
generating a timing interpolation parameter that is indicative of a time delay between the first trigger signal and the second trigger signal;
using the second trigger signal and the timing interpolation parameter to provide a first visual representation of the first input signal on a display screen of the first oscilloscope; and
generating a slave signal that includes the second trigger signal and the timing interpolation parameter, the slave signal useable by a second oscilloscope to provide a second visual representation of a second input signal on a display screen of the second oscilloscope, the second visual representation having a timing alignment with the first visual representation.

15. The method of claim 14, further comprising:
transmitting the slave signal to the second oscilloscope, the slave signal including a set of binary bits representing the timing interpolation parameter that is indicative of the time delay between the first trigger signal and the second trigger signal.

16. The method of claim 15, wherein the slave signal is a composite signal formed by combining the timing interpolation parameter with the second trigger signal.

17. The method of claim 16, wherein the composite signal is transmitted to the second oscilloscope in a serial transmission format.

18. The method of claim 14, wherein generating the slave signal comprises:
generating a time delay indicator pulse that represents the time delay between the first trigger signal and the second trigger signal;
using the time delay indicator pulse to generate the timing interpolation parameter; and
combining the timing interpolation parameter with the second trigger signal to generate the slave signal.

19. The method of claim 18, wherein using the time delay indicator pulse to generate the timing interpolation parameter comprises:

using the time delay indicator pulse to execute a gating function upon the first clock and obtain a clock cycles count that represents the timing interpolation parameter.

20. The method of claim 18, further comprising:

generating the first clock from a reference clock that is provided to the first oscilloscope;

providing the reference clock to the second oscilloscope;

transmitting the slave signal from the first oscilloscope to the second oscilloscope; and using the reference clock and the slave signal in the second oscilloscope to provide the second visual representation of the second input signal.

* * * * *